US012573232B2

(12) United States Patent
Kim et al.

(10) Patent No.: US 12,573,232 B2
(45) Date of Patent: **\*Mar. 10, 2026**

(54) DISPLAY DEVICE INCLUDING A FINGERPRINT SENSOR

(71) Applicant: SAMSUNG DISPLAY CO., LTD., Yongin-si (KR)

(72) Inventors: Yun Ho Kim, Yongin-si (KR); Keum Dong Jung, Yongin-si (KR); Jin Oh Kwag, Yongin-si (KR); Won Sang Park, Yongin-si (KR); Deok Hwa Woo, Yongin-si (KR); Bong Hyun You, Yongin-si (KR); Chul Kim, Yongin-si (KR); Seung Hyun Moon, Yongin-si (KR); Jun Hee Moon, Yongin-si (KR); Hee Chul Hwang, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 18/451,053

(22) Filed: Aug. 16, 2023

(65) Prior Publication Data

US 2023/0397472 A1 Dec. 7, 2023

Related U.S. Application Data

(63) Continuation of application No. 16/992,801, filed on Aug. 13, 2020, now Pat. No. 11,758,793.

(30) Foreign Application Priority Data

Sep. 6, 2019 (KR) ........................ 10-2019-0110917

(51) Int. Cl.
*G06V 40/13* (2022.01)
*G06V 40/12* (2022.01)
(Continued)

(52) U.S. Cl.
CPC ...... *G06V 40/1388* (2022.01); *G06V 40/1318* (2022.01); *G06V 40/1394* (2022.01); *H10F 39/198* (2025.01); *H10F 39/8057* (2025.01)

(58) Field of Classification Search
CPC .............. G06K 9/0004; G06V 40/1318; H01L 27/3227; H01L 27/3234
See application file for complete search history.

(56) References Cited

U.S. PATENT DOCUMENTS

| 7,783,088 B2 | 8/2010 | Shinzaki et al. |
| 10,438,046 B2 | 10/2019 | He et al. |

(Continued)

FOREIGN PATENT DOCUMENTS

| CN | 106298859 A | 1/2017 |
| CN | 106991366 A | 7/2017 |

(Continued)

*Primary Examiner* — Yuzhen Shen
(74) *Attorney, Agent, or Firm* — F. CHAU & ASSOCIATES, LLC

(57) ABSTRACT

Provided is a display device including a substrate including a fingerprint area. The fingerprint area includes a first area and a second area. A light-emitting element layer is disposed on the substrate. The light-emitting element layer includes light-emitting elements. A sensor layer is disposed on the substrate, the sensor layer including photosensors. The light-emitting elements include a first light-emitting element arranged in the first area and a second light-emitting element arranged in the second area. During a fingerprint sensing period, the first light-emitting element emits light and the second light-emitting element does not emit light.

14 Claims, 12 Drawing Sheets

(51) Int. Cl.
    *H10F 39/00*      (2025.01)
    *H10F 39/12*      (2025.01)

(56)                 References Cited

U.S. PATENT DOCUMENTS

| | | | |
|---|---|---|---|
| 10,503,947 B2 | 12/2019 | Liu et al. | |
| 11,003,266 B2 | 5/2021 | Kim et al. | |
| 2014/0355846 A1 * | 12/2014 | Lee | G06V 40/1318 |
| | | | 382/124 |
| 2017/0316248 A1 | 11/2017 | He et al. | |
| 2017/0364728 A1 | 12/2017 | Bachurinskii et al. | |
| 2018/0089491 A1 * | 3/2018 | Kim | G02B 6/0088 |
| 2018/0357402 A1 * | 12/2018 | Omata | G06V 40/1365 |
| 2019/0102595 A1 | 4/2019 | Lee et al. | |
| 2019/0102598 A1 * | 4/2019 | Jiang | G06V 40/1382 |
| 2019/0157337 A1 | 5/2019 | Lin et al. | |
| 2020/0243620 A1 | 7/2020 | Abe et al. | |
| 2020/0401782 A1 * | 12/2020 | Cheng | G06V 40/1394 |
| 2021/0004562 A1 * | 1/2021 | Chiang | G06V 40/45 |
| 2021/0073607 A1 | 3/2021 | Kim et al. | |
| 2021/0312027 A1 * | 10/2021 | Zou | G06V 40/45 |
| 2022/0012452 A1 * | 1/2022 | Li | G06F 21/32 |
| 2022/0057664 A1 * | 2/2022 | Higano | G02F 1/133514 |

FOREIGN PATENT DOCUMENTS

| | | | | |
|---|---|---|---|---|
| CN | 107820617 A | 3/2018 | | |
| CN | 109478083 A | 3/2019 | | |
| CN | 110047872 A | 7/2019 | | |
| CN | 111209875 A | * 5/2020 | | G06K 9/0004 |
| KR | 10-2007-0093312 | 9/2007 | | |
| KR | 10-2017-0116530 | 10/2017 | | |
| KR | 10-1923335 | 2/2019 | | |
| KR | 10-2019-0037728 | 4/2019 | | |

* cited by examiner

FIG. 16

DISPLAY DEVICE INCLUDING A FINGERPRINT SENSOR

CROSS-REFERENCE TO RELATED APPLICATION

The present application is a Continuation of co-pending U.S. patent application Ser. No. 16/992,801, filed on Aug. 13, 2020, which claims priority under 35 U.S.C. § 119 to Korean patent application number 10-2019-0110917 filed on Sep. 6, 2019, the entire disclosure of which is incorporated by reference herein in its entirety.

1. TECHNICAL FIELD

The present invention relates to a display device, and more particularly, to a display device having a fingerprint sensor.

2. DISCUSSION OF RELATED ART

Recently, as display devices, such as a smartphone or a tablet personal computer (PC), are utilized in various fields, a biometric information authentication scheme using a user's fingerprint or the like has been widely used. In order to provide a fingerprint sensing function, a fingerprint sensor may be provided in such a way as to be built in or attached to a display device.

A photosensing-type fingerprint sensor may include a light source and a photosensor. The photosensor may receive reflected light from a user's fingertip, and may then acquire corresponding fingerprint information. Since a photosensing-type fingerprint sensor may recognize a fake fingerprint made of various materials, such as paper, an overhead projector (OHP) film, rubber, or gelatin, as a real biometric fingerprint, the potentiality for unauthorized use of the device may exist.

SUMMARY

According to an exemplary embodiment of the present invention, provided is a display device including a substrate including a fingerprint area. The fingerprint area includes a first area and a second area. A light-emitting element layer is disposed on the substrate. The light-emitting element layer includes light-emitting elements. A sensor layer is disposed on the substrate and includes photosensors. The light-emitting elements include a first light-emitting element arranged in the first area and a second light-emitting element arranged in the second area. During a fingerprint sensing period, the first light-emitting element emits light and the second light-emitting element does not emit light.

According to an exemplary embodiment of the present invention, a fingerprint detector is provided and configured to receive sensing signals from photosensors arranged in the first area to generate a fingerprint authentication image, and to receive sensing signals from photosensors arranged in the second area to generate a fake verification image.

According to an exemplary embodiment of the present invention, the fingerprint detector performs a fingerprint authentication procedure based on the fingerprint authentication image.

According to an exemplary embodiment of the present invention, the fingerprint detector generates an average gray level of the fake verification image as a verification value.

According to an exemplary embodiment of the present invention, the fingerprint detector compares the verification value with a preset reference value, and then determines whether a sensing target located in the fingerprint area is a fake fingerprint.

According to an exemplary embodiment of the present invention, when the verification value is greater than the reference value, the fingerprint detector determines that the sensing target is a biometric fingerprint, and when the verification value is less than or equal to the reference value, the fingerprint detector determines that the sensing target is a fake fingerprint.

According to an exemplary embodiment of the present invention, a light-blocking layer is interposed between the substrate and the light-emitting element layer. The light-blocking layer includes openings.

According to an exemplary embodiment of the present invention, the light-blocking layer blocks a part of external light and transfers a remaining part of the external light to the sensor layer through the openings.

According to an exemplary embodiment of the present invention, a first photosensor receives light that is incident through a first opening and such that a second photosensor receives no light or receives light that is incident through two or more openings.

According to an exemplary embodiment of the present invention, a circuit-element layer interposed between the light-blocking layer and the light-emitting element layer, and wherein circuit elements for driving the light-emitting elements are disposed in the circuit-element layer.

According to an exemplary embodiment of the present invention, the first area encloses the second area.

According to an exemplary embodiment of the present invention, the fingerprint area further includes a third area, and the light-emitting elements further include a third light-emitting element arranged in the third area.

According to an exemplary embodiment of the present invention, the first area encloses the third area, and the third light-emitting element does not emit light during the fingerprint sensing period.

According to an exemplary embodiment of the present invention, the second area and the third area are spaced apart from each other.

According to an exemplary embodiment of the present invention, the second area encloses the third area, and the third light-emitting element emits light during the fingerprint sensing period.

According to an exemplary embodiment of the present invention, the second area encloses the first area.

According to an exemplary embodiment of the present invention, the fingerprint area further includes a third area, and the light-emitting elements further include a third light-emitting element arranged in the third area.

According to an exemplary embodiment of the present invention, the second area encloses the third area, and the third light-emitting element emits light during the fingerprint sensing period.

According to an exemplary embodiment of the present invention, wherein the first area and the third area are spaced apart from each other.

According to an exemplary embodiment of the present invention, the first area encloses the third area, and the third light-emitting element does not emit light during the fingerprint sensing period.

According to an exemplary embodiment of the present invention, a display device, is provided including a substrate including a fingerprint area. The fingerprint area includes a first area and a second area. A light-emitting element layer is disposed on the substrate, the light-emitting element layer includes at least one light-emitting element. A sensor layer is disposed on the substrate, the sensor layer includes at least one photosensor. The at least one light-emitting element is arranged in the first area. The at least one photosensor is disposed in the second area. The at least one photosensor receives dispersed and/or scattered light from a target object overlapping the first area.

BRIEF DESCRIPTION OF THE DRAWINGS

FIGS. 12, 13, 14, 15 and 16 are plan views illustrating a fingerprint area of a display device according to various exemplary embodiments of the present invention.

DETAILED DESCRIPTION OF THE EMBODIMENTS

The present invention will be described more fully hereinafter with reference to the accompanying drawings, in which exemplary embodiments of the present invention are shown.

Figures 1, 2:
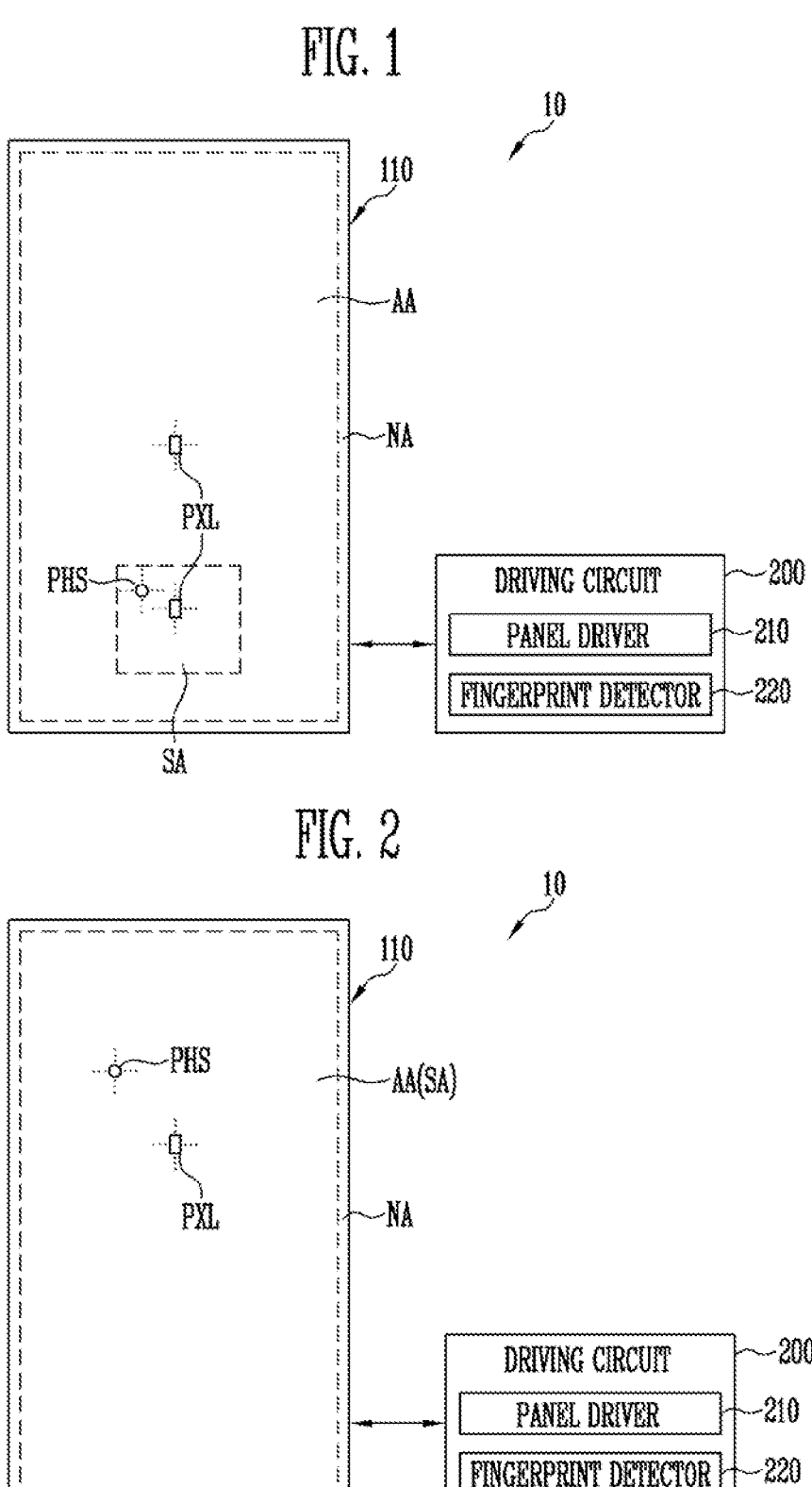
FIGS. 1 and 2 are plan views schematically illustrating a display device according to an exemplary embodiment of the present invention.

FIGS. 1 and 2 are plan views schematically illustrating a display device according to an exemplary embodiment of the present invention. FIGS. 1 and 2 are diagrams schematically illustrating a display panel 110 provided in a display device 10 according to an exemplary embodiment of the present invention and a driving circuit 200 configured to drive the display panel 110. Although, for convenience of description, the display panel 110 and the driving circuit 200 are separately illustrated in FIGS. 1 and 2, the present disclosure is not limited thereto. For example, all or part of the driving circuit 200 may be integrated into the display panel 110.

Referring to FIGS. 1 and 2, the display device 10 may include the display panel 110 and the driving circuit 200 for driving the display panel 110.

The display panel 110 may include a display area AA and a non-display area NA. The display area AA may be an area in which a plurality of pixels PXL (or sub-pixels) are provided, and may also be referred to herein as an active area. In various exemplary embodiments of the present invention, the pixels PXL may each include at least one light-emitting element. The display device 10 displays an image in the display area AA by driving the pixels PXL in accordance with externally input image data.

In various exemplary embodiments of the present invention, the display area AA may include a sensing area SA. The sensing area SA may include at least some of the pixels PXL provided in the display area AA.

In an exemplary embodiment of the present invention, as illustrated in FIG. 1, at least a part of the display area AA may be set as the sensing area SA. In an exemplary embodiment of the present invention, as illustrated in FIG. 2, the entire display area AA may also be set as the sensing area SA.

Although an example in which only a single sensing area SA is formed is illustrated in FIG. 1, the present invention is not limited thereto. For example, in various exemplary embodiments of the present invention, a plurality of sensing areas SA that are regularly or irregularly arranged may be formed in the display area AA. In this embodiment, the plurality of sensing areas SA may have identical or different sizes and shapes, and may be contiguous or remotely spaced.

Although an example in which the sensing area SA is formed in at least a part of the display area AA is illustrated in FIG. 1, the present invention is not limited thereto. For example, in various exemplary embodiments of the present invention, the display area AA and the sensing area SA may be provided to overlap each other only in at least a partial area.

The non-display area NA may be an area arranged around the display area AA (e.g., the perimeter in a plan view), and may also be referred to as a non-active area. In various exemplary embodiments of the present invention, the non-display area NA may inclusively mean the remaining area other than the display area AA in the display panel 110. In an exemplary embodiment of the present invention, the non-display area NA may include a wiring area, a pad area, various types of dummy areas, etc.

In various exemplary embodiments of the present invention, the display device 10 may further include a plurality of photosensors PHS provided in the sensing area SA. In an exemplary embodiment of the present invention, the photosensors PHS may detect that light emitted from a light source is reflected from a user's finger, may analyze the reflected light, and may then detect the user's fingerprint. Hereinafter, although an example in which the photosensors PHS are used to detect a fingerprint will be described, the photosensors PHS may be used to perform various functions, as in the case of a touch sensor or a scanner.

In various exemplary embodiments of the present invention, the photosensors PHS may be arranged in the sensing area SA. The photosensors PHS may be arranged to overlap at least some or all of the pixels PXL provided in the sensing area SA, or may be arranged near the pixels PXL, for example, in a staggered arrangement. For example, at least some or all of the photosensors PHS may be provided between the pixels PXL. Various exemplary embodiments of arrangement relationships between the photosensors PHS and the pixels PXL will be described in detail later on herein with reference to FIGS. 3A, 3B, 3C, 3D and 3E.

In an exemplary embodiment of the present invention in which the photosensors PHS are arranged adjacent to the pixels PXL, the photosensors PHS may use a light-emitting element, which is provided in at least one pixel PXL arranged in or near the sensing area SA, as a light source. In this exemplary embodiment of the present invention, the photosensors PHS and corresponding pixels PXL (e.g., the light-emitting elements thereof) may collectively constitute a photo-sensing-type fingerprint sensor. In this way, when a fingerprint sensor-embedded display device is configured by using the pixels PXL as light sources without requiring a separate external light source, the module thickness of the photo-sensing-type fingerprint sensor and the display device equipped with the photo-sensing-type fingerprint sensor may be reduced, and manufacturing costs thereof may be reduced.

In various exemplary embodiments of the present invention, the photosensors PHS may be arranged on a second surface (e.g., a rear surface) opposing a first surface on which an image is displayed (e.g., a front surface) or between the first and second surfaces of the display panel 110. However, the present invention is not limited thereto.

The driving circuit 200 may drive the display panel 110. For example, the driving circuit 200 may output data signals corresponding to image data to the display panel 110 or output driving signals for the photosensors PHS, and may receive sensing signals from the photosensors PHS. The driving circuit 200, having received the sensing signals, may detect the shape of the user's fingerprint using the sensing signals.

In various exemplary embodiments of the present invention, the driving circuit 200 may include a panel driver 210 and a fingerprint detector 220. For convenience of description, although the panel driver 210 and the fingerprint detector 220 are separately illustrated in FIGS. 1 and 2, the present invention is not limited thereto. For example, at least a part of the fingerprint detector 220 may be integrated with the panel driver 210, or may be operated in conjunction with the panel driver 210.

The panel driver 210 may supply data signals corresponding to image data to the pixels PXL while sequentially scanning the pixels PXL in the display area AA. Then, the display panel 110 may display an image corresponding to the image data.

In an exemplary embodiment of the present invention, the panel driver 210 may supply driving signals for fingerprint sensing to the pixels PXL. The driving signals may be provided such that the pixels PXL emit light to function as light sources for the photosensors PHS. In this exemplary embodiment of the present invention, the driving signals for fingerprint sensing may be provided to pixels PXL provided in a specific area in the display panel 110, for example, in the sensing area SA.

In some exemplary embodiments of the present invention, the driving signals for fingerprint sensing may be provided only to some of the pixels PXL provided in the sensing area SA, and may not be provided to the remaining pixels. For example, the partial area of the sensing area SA may be an emission area, and the remaining partial area may be a non-emission area. When the sensing area SA includes the non-emission area, the fingerprint sensor may simultaneously determine whether a fingerprint has been authenticated and whether the sensing target (e.g., the fingerprint) is a fake fingerprint. In relation to this operation, a detailed description will be made later on herein with reference to FIGS. 9, 10 and 11.

The driving signals for fingerprint sensing may be provided by the fingerprint detector 220. The fingerprint detector 220 may transfer the driving signals for driving the photosensors PHS to the photosensors PHS, and may detect the user's fingerprint based on the sensing signals received from the photosensors PHS.

FIGS. 3A 3B, 3C, 3D and 3E are plan views illustrating various embodiments of an array structure including pixels and photosensors. FIGS. 3A, 3B, 3C, 3D and 3E illustrate embodiments of different relative sizes, resolutions, and array relationships between one or more pixels PXL and photosensors PHS provided in a sensing area SA.

Figures 3A, 3B:
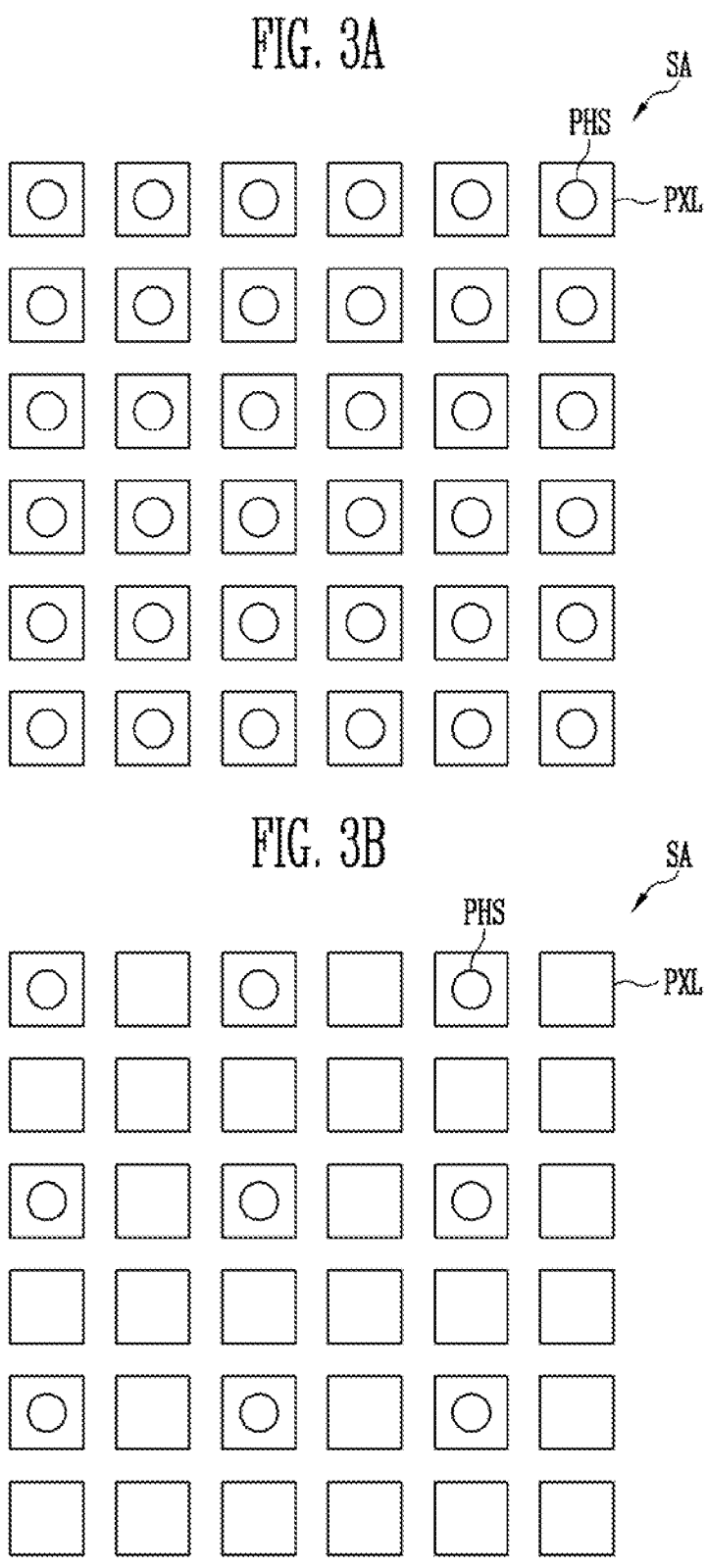
FIGS. 3A, 3B, 3C, 3D and 3E are plan views illustrating various embodiments of an array structure including pixels and photosensors according to an exemplary embodiment of the present invention.

Referring to FIG. 3A, the photosensors PHS may be arranged at the same resolution (density) as the pixels PXL in the sensing area SA. For example, the same number of photosensors PHS as the number of pixels PXL may be arranged in the sensing area SA. In this exemplary embodiment of the present invention, the pixels PXL and the photosensors PHS may be arranged to form respective pairs in a one-to-one correspondence. However, the present invention is not limited thereto. In the exemplary embodiment of the present invention shown in FIG. 3A, the pixels PXL and the photosensors PHS are illustrated as overlapping each other. For example, the photosensor PHS of each photo-sensing-type fingerprint sensor may be disposed overlapping a central portion of a respective pixel PXL. However, in exemplary embodiments of the present invention, the pixels PXL and the photosensors PHS may be arranged not to overlap each other, or may be arranged to partially overlap each other. The photo-sensing-type fingerprint sensors may be disposed in rows and columns and spaced at regular or irregular intervals. Adjacent photo-sensing-type fingerprint sensors may be aligned.

Although, in the exemplary embodiment of the present invention depicted in FIG. 3A, the photosensors PHS are illustrated as having sizes smaller than those of the pixels PXL, the present invention is not limited thereto. For example, the photosensors PHS may have sizes equal to or greater than those of the pixels PXL in a plan view. Exemplary Embodiments of the present invention related thereto are illustrated in FIGS. 3C and 3D.

Referring to FIGS. 3B to 3E, the photosensors PHS may be arranged at a resolution lower than that of the pixels PXL in the sensing area SA. For example, a number of photosensors PHS less than the number of pixels PXL may be arranged in the sensing area SA. Photo-sensing-type fingerprint sensors comprised of a photosensor PHS disposed in a central portion of a respective pixel PXL may be alternately disposed in rows and columns with pixels PXL that do not overlap photosensors PHS. Although examples in which one photosensor PHS is disposed every square of four pixels PXL (e.g., a 2×2 array of pixels PXL) are illustrated in FIGS. 3B, 3C, 3D and 3E, the present invention is not limited thereto.

Figures 3C, 3D:
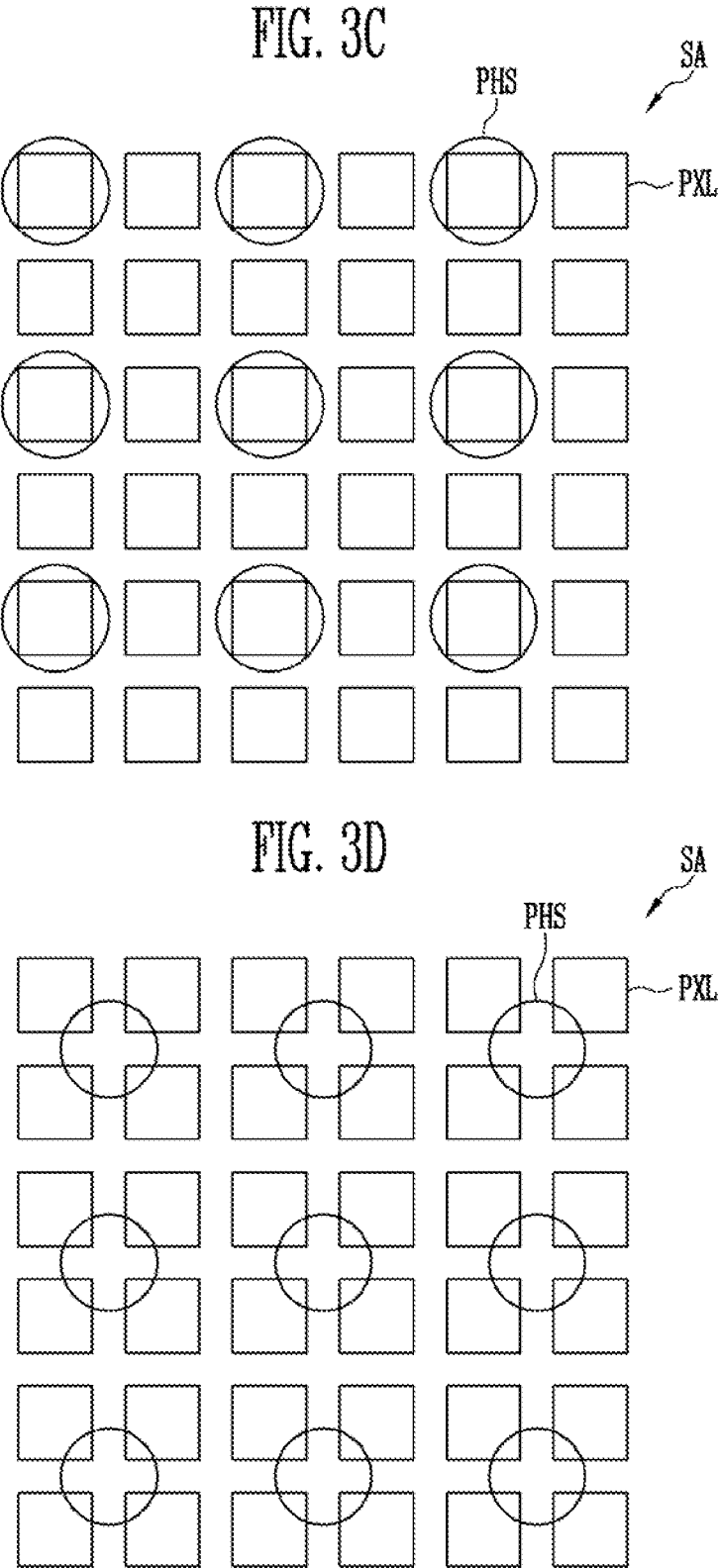
Figure 3E:
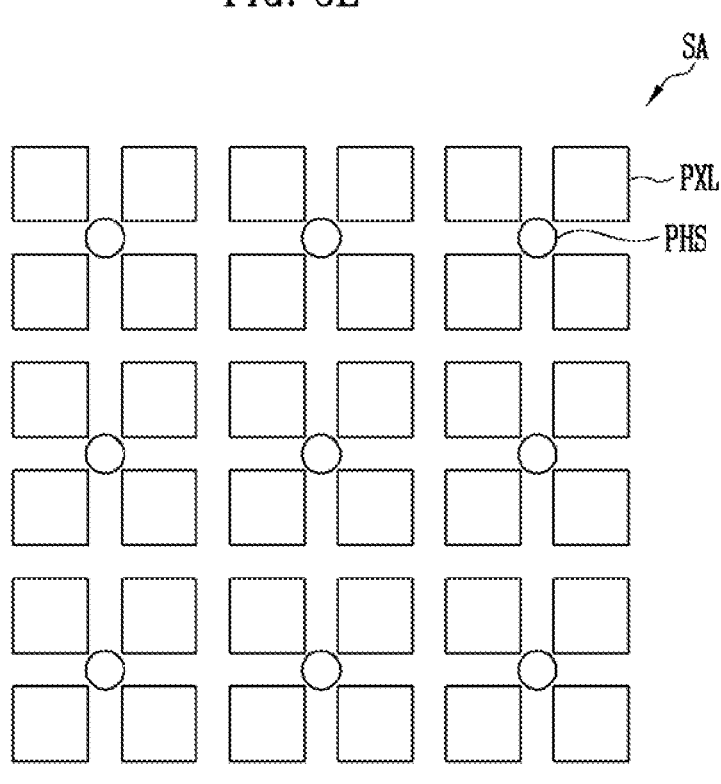

In this exemplary embodiment of the present invention, the photosensors PHS may have sizes smaller than those of the pixels PXL, as illustrated in FIGS. 3B and 3E, or may have sizes larger than those of the pixels PXL, as illustrated in FIGS. 3C and 3D.

When the photosensors PHS are arranged at a resolution lower than that of the pixels PXL, some or all of the photosensors PHS may be arranged to overlap the pixels PXL. For example, the photosensors PHS may partially overlap some of the pixels PXL, as illustrated in FIGS. 3B and 3C.

Alternatively, the photosensors PHS may be disposed among the pixels PXL to partially overlap the pixels PXL, as illustrated in FIG. 3D. In this exemplary embodiment of the present invention, the photosensors PHS may have sizes larger than a size of respective pixels PXL, as illustrated in FIG. 3D. For example, each of the photosensors PHS may have a size sufficient to cover at least one pixel PXL. In the exemplary embodiment of the present invention depicted in FIG. 3C, each photo-sensing-type fingerprint sensor may be comprised of a photosensor PHS that entirely overlaps a respective pixel PXL. In the exemplary embodiment of the present invention depicted in FIG. 3D, each photo-sensing-type fingerprint sensor may be comprised of a photosensor PHS that overlaps adjacent corners of four neighboring pixels PXL facing one another.

However, the present invention is not limited thereto. For example, the photosensors PHS may not overlap the pixels PXL, as illustrated in FIG. 3E. In the exemplary embodiment of the present invention shown in FIG. 3E, the photosensor PHS, of relatively smaller size than a pixel PXL, may be disposed between four adjacent corners of a pixel square (e.g., a 2×2 array of pixels PXL).

In various exemplary embodiments of the present invention, an array structure of the pixels PXL and the photosensors PHS is not limited to the above-described structures. For example, the shapes, arrays, relative sizes, numbers, resolution, etc. of the pixels PXL and the photosensors PHS in the sensing area SA may be modified in various forms within the scope of the present invention. Also, in various exemplary embodiments of the present invention, the pixels PXL and the photosensors PHS may be arranged in a form in which one or more of the exemplary embodiments of the present invention depicted in FIGS. 3A, 3B, 3C, 3D and 3E are combined with each other.

Also, although an example in which the photosensors PHS are regularly arranged in the sensing area SA is illustrated in FIGS. 3A, 3B, 3C, 3D and 3E, the present invention is not limited thereto, and in various exemplary embodiments of the present invention, the photosensors PHS may be irregularly arranged in the sensing area SA.

Figure 4:
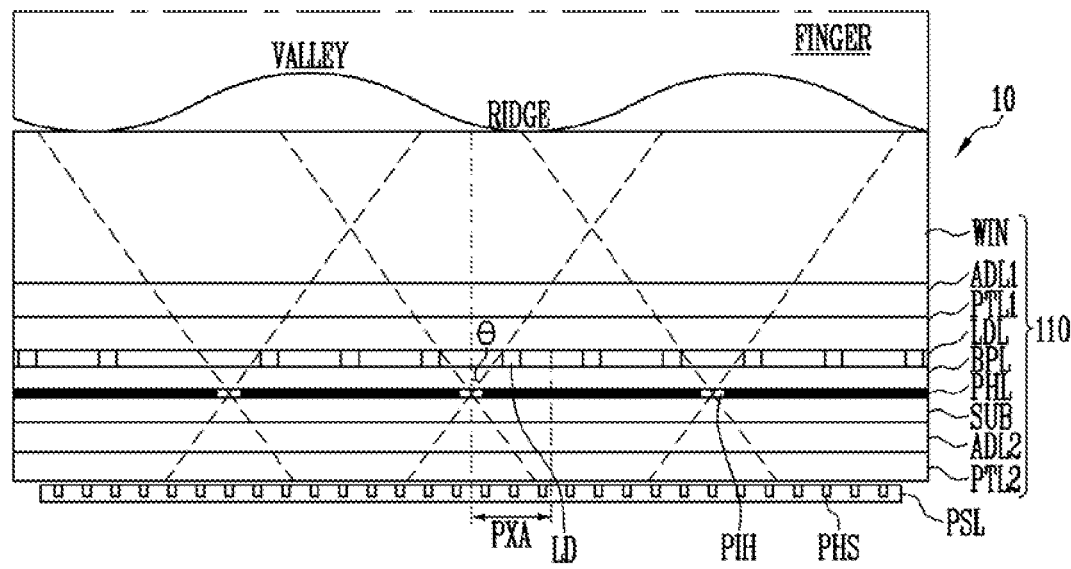
FIG. 4 is a schematic cross-sectional view illustrating a display panel according to an exemplary embodiment of the present invention.
Figure 5:
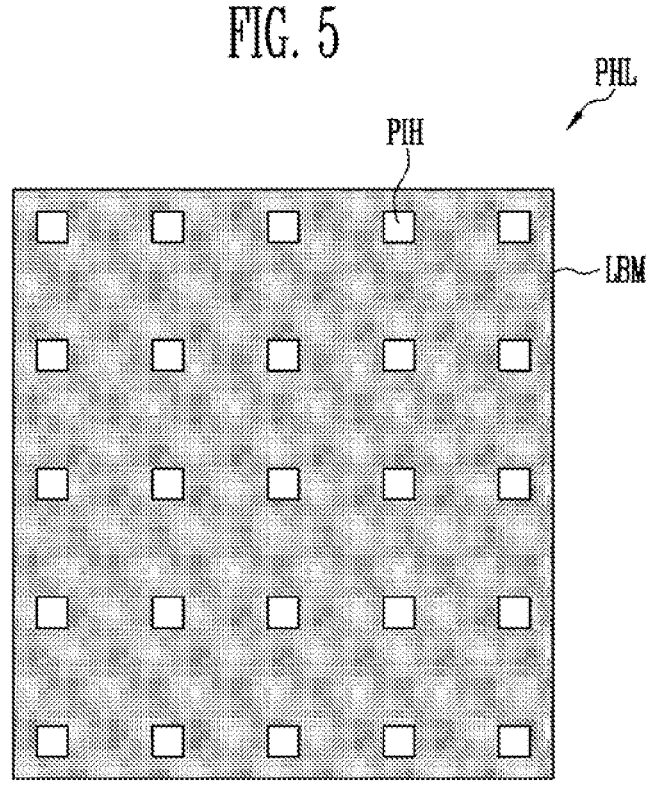
FIG. 5 is a plan view illustrating a light-blocking layer according to an exemplary embodiment of the present invention.

FIG. 4 is a schematic sectional view of a display panel according to an exemplary embodiment of the present invention. In particular, FIG. 4 is a sectional view of the display device 10 illustrated in FIGS. 1 and 2 in the sensing area SA. FIG. 5 is a plan view illustrating a light-blocking layer according to an exemplary embodiment of the present invention.

Referring to FIG. 4, the sensing area SA of the display device 10 according to an exemplary embodiment of the present invention may include a display panel 110 and a sensor layer PSL disposed on a first surface of the display panel 110. Also, the display device 10 may include a substrate SUB, and a circuit-element layer BPL, a light-emitting element layer LDL, a first protective layer PTL1, a first adhesive layer ADL1, and a window WIN, which are sequentially disposed on a first surface (e.g., a top surface) of the substrate SUB. Further, the display device 10 may include a second adhesive layer ADL2 and a second protective layer PTL2, which are sequentially disposed on a second surface (e.g., a bottom surface) of the substrate SUB.

The substrate SUB, which is a base material of the display panel 110, may be a substantially transparent light-transmissive substrate. The substrate SUB may be either a rigid substrate including glass or reinforced glass and/or a flexible substrate made of a plastic material. However, the material of the substrate SUB is not limited thereto, and the substrate SUB may be made of any of various materials.

The substrate SUB may include a display area AA and a non-display area NA, such as those illustrated in FIGS. 1 and 2. Further, the display area AA may include a plurality of pixel areas PXA in which respective pixels PXL are arranged and/or formed.

The circuit-element layer BPL may be arranged between the first surface of the substrate SUB and the light-emitting element layer LDL, and may include at least one conductive layer. For example, the circuit-element layer BPL may include a plurality of circuit elements constituting the pixel circuits of the pixels PXL and lines for supplying various types of power and signals required in order to drive the pixels PXL. In this case, the circuit-element layer BPL may include a plurality of conductive layers for forming various types of circuit elements, such as at least one transistor and at least one capacitor, and lines coupled to the circuit elements. Also, the circuit-element layer BPL may include at least one insulating layer provided between the plurality of conductive layers. Furthermore, the circuit-element layer BPL may include a wiring unit which is arranged in the non-display area NA of the substrate SUB to supply power and signals corresponding to the lines coupled to the pixels PXL.

The light-emitting element layer LDL may be disposed between a first surface of the circuit-element layer BPL and a first protective layer PTL1. The light-emitting element layer LDL may include a plurality of light-emitting elements LD coupled to the circuit elements and/or lines of the circuit-element layer BPL via contact holes or the like. In an exemplary embodiment of the present invention, at least one of the plurality of light-emitting elements LD may be arranged in each pixel area PXA.

The plurality of light-emitting elements LD may emit light components in different colors. In an exemplary embodiment of the present invention, the plurality of light-emitting elements LD may include a red light-emitting element for emitting red light, a green light-emitting element for emitting green light, and a blue light-emitting element for emitting blue light. In an exemplary embodiment of the present invention, the plurality of light-emitting elements LD may include a yellow light-emitting element for emitting yellow light, a cyan light-emitting element for emitting cyan light, and a magenta light-emitting element for emitting magenta light. However, the types of light-emitting elements are not limited thereto, and respective light emitting-elements LD may emit light components in the same color.

Each of the pixels PXL may include circuit elements disposed in the circuit-element layer BPL and at least one light-emitting element LD disposed in the light-emitting element layer LDL on the top of the circuit-element layer BPL. The structure of each pixel PXL will be described in detail later.

The first protective layer PTL1 may be disposed between the top of the light-emitting element layer LDL and the first adhesive layer ADL1 to cover the display area AA. The first protective layer PTL1 may include a sealing element, such as a thin-film encapsulation (TFE) layer or an encapsulation substrate, and may additionally include a protective film or the like in addition to the sealing element.

The first adhesive layer ADL1 may be interposed between the first protective layer PTL1 and the window WIN to couple the first protective layer PTL1 to the window WIN. The first adhesive layer ADL1 may contain a transparent adhesive, such as an optical clear adhesive (OCA), and may additionally contain various types of adhesive materials.

The window WIN may be a protective element disposed in an uppermost portion of the module of the display device 10 including the display panel 110, and may be a substantially transparent light-transmissive substrate. Such a window WIN may have a multilayer structure selected from among a glass substrate, a plastic film, and a plastic substrate. The window WIN may include a rigid or flexible material, and the material used to form the window WIN is not especially limited as long as the window WIN is formed of a transparent transmissive material.

In various exemplary embodiments of the present invention, the display device 10 may further include a polarizing plate (not illustrated) and/or a touch sensor layer (touch electrode layer). For example, the display device 10 may further include a polarizing plate and/or a touch sensor layer, which are interposed between the first protective layer PTL1 and the window WIN.

The second protective layer PTL2 may be arranged on a second surface of the substrate SUB. The second protective layer PTL2 may be coupled to the substrate SUB through the second adhesive layer ADL2.

The second adhesive layer ADL2 may firmly couple (or attach) the substrate SUB and the second protective layer PTL2 to each other. The second adhesive layer ADL2 may contain a transparent adhesive, such as OCA. The second adhesive layer ADL2 may contain a pressure sensitive adhesive (PSA) on which an adhesive material acts when pressure for bonding the second adhesive layer ADL2 to an adherend is applied. When the second adhesive layer ADL2 contains a pressure sensitive adhesive, the second adhesive layer ADL2 may be attached to the adherend using only pressure without requiring separate heat treatment or UV treatment.

In an exemplary embodiment of the present invention, the second adhesive layer ADL2 may contain a material which absorbs specific light or a material which blocks the specific light. For example, the second adhesive layer ADL2 may contain an infrared-absorbing material which absorbs infrared light having high energy density, or an infrared-shielding material which blocks the infrared light.

The infrared-absorbing material may include an inorganic oxide containing Antimony Tin Oxide (ATO), Indium Tin Oxide (ITO), tungsten oxide, or carbon black, and a metal material, such as silver (Ag). The inorganic oxide may selectively transmit light in a visible light frequency band, and may absorb infrared light. Further, the infrared-absorbing material may include, for example, organic dyes. The organic dyes may be dyes used for, for example, color filters provided in the display panel 110.

The infrared-shielding material may include a borate mixture, a carbonate mixture, an aluminate mixture, a nitrate mixture, a nitrite mixture, lithium borate, sodium borate, potassium borate, magnesium borate, calcium borate, strontium borate, barium borate, $Na_2B_4O_x$, colemanite, lithium carbonate, sodium carbonate, potassium carbonate, calcium carbonate, calcite, $CaCO_3$, dolomite, and/or magnesite. Also, the infrared-shielding material may include dyes ssuch as nickel dithiol, dithiol metal complex, cyanin, squarylium, croconium, diimmonium, aminium, ammonium, phthalocyanine, naphthalocyanine, anthraquinone, naphthoquinone, condensation polymer azo-based pyrrole, polymethine, and/or propylene-based compounds.

When the user's hand reaches (or is positioned on) the display surface (e.g., a surface on which an image is displayed) of the display device 10, the display device 10 may perform a function of sensing the user's fingerprint through photosensors PHS, which will be described later on herein. When external light flows into the display device 10 during an operation for sensing the user's fingerprint, a visible light frequency band of the external light may be blocked by the user's hand, but infrared light may pass through the user's hand, and may then be incident on the photosensors PHS. The infrared light incident on the photosensors PHS may act as noise, thus decreasing the accuracy of recognition of light reflected from the user's hand.

As in the above-described exemplary embodiment of the present invention, when the second adhesive layer ADL2 contains an infrared-absorbing material and/or an infrared-shielding material, the infrared light of the external light is absorbed and/or blocked by the second adhesive layer ADL2 and is not incident on the photosensors PHS even if the infrared light of the external light passes through the user's hand, thus increasing the accuracy of fingerprint recognition.

The second protective layer PTL2 may prevent a penetration of oxygen and moisture from the outside, and may be provided in a single-layer form or a multilayer form. The second protective layer PTL2 may be formed in the shape of a film, and may further secure the flexibility of the display panel 110. The second protective layer PTL2 may be coupled to the sensor layer PSL through an additional adhesive layer which contains a transparent adhesive, such as OCA.

In various exemplary embodiments of the present invention, a selective light-shielding film may be further provided on the bottom of the second protective layer PTL2. The selective light-shielding film may block a specific wavelength frequency band contained in external light flowing into the display device 10, for example, an infrared light frequency band, thus preventing the corresponding infrared light from being incident on the photosensors PHS of the sensor layer PSL. Although the selective light-shielding film is described as being further provided on the bottom of the second protective layer PTL2, the present invention is not limited thereto. For example, in an exemplary embodiment of the present invention, as long as the selective light-shielding film may be arranged on the top of the sensor layer PSL, the light-shielding film may be freely provided on any layer of the display device 10. Also, the selective light-shielding film may be omitted when a component for blocking infrared light is included in the display panel 110.

The light-blocking layer PHL may be interposed between the light-emitting element layer LDL and the sensor layer PSL, which will be described later on herein. For example, the light-blocking layer PHL may be interposed between the substrate SUB and the circuit-element layer BPL, as illustrated in FIG. 4. In various exemplary embodiments of the present invention, the light-blocking layer PHL may include a plurality of pinholes PIH. The light-blocking layer PHL may block part of externally incident light, for example, reflected light that has been reflected from a finger, and may then enable the remaining part of the light to reach a bottom layer thereof through the pinholes PIH.

The widths (e.g., the diameters) of the pinholes PIH may be configured such that light satisfying a field of view FOV (θ, or also referred to as a "viewing angle") falling within a predetermined angle range can pass through each pinhole PIH.

Also, the widths (e.g., the diameters) of the pinholes PIH may be set to a value that is about more than ten times as large as the wavelength of reflected light. For example, the widths of the pinholes PIH may be 4 μm or 5 μm or more so that diffraction of light can be prevented. Further, the widths of the pinholes PIH may be set to a size sufficient to prevent an image blur and to more clearly sense the shape of a fingerprint. For example, the widths of the pinholes PIH may be set to a value less than or equal to about 20 μm. However, the present invention is not limited thereto, and the widths of the pinholes PIH may vary depending on the wavelength frequency band of reflected light and/or the thickness of each layer of the module.

An interval (e.g., a pitch) between adjacent pinholes PIH may be set in consideration of the distance between the light-blocking layer PHL and the sensor layer PSL, and the wavelength range of reflected light. For example, the interval between adjacent pinholes PIH may be set to a value that is twice or more the distance between the light-blocking layer PHL and the sensor layer PSL, which will be described later, and may be set to a value that is equal to or greater than a value obtained by adding a predetermined error range to the distance. In this case, images observed by respective photosensors PHS may be prevented from overlapping each other, and thus an image blur in a fingerprint image may be prevented.

The sensor layer PSL may be attached to the second surface (e.g., a rear surface) of the display panel 110 to overlap at least one region of the display panel 110. The sensor layer PSL may be arranged to overlap the display panel 110 in at least the display area AA. Such a sensor layer PSL may include a plurality of photosensors PHS that are distributed at a predetermined resolution and/or at a predetermined interval. The intervals between the photosensors PHS may be densely set such that light reflected from an observation target (e.g., a specific area of a finger, such as a fingerprint area) is incident on at least two neighboring photosensors PHS.

The photosensors PHS of the sensor layer PSL may output an electrical signal, corresponding to the reflected light received after passing through the pinholes PIH, as a sensing signal. Reflected light components received by respective photosensors PHS may have different optical characteristics (e.g., frequency, wavelength, intensity, etc.) depending on whether the corresponding reflected light is generated due to the valley or ridge of the fingerprint formed on the user's finger). Therefore, the photosensors PHS may output sensing signals having different electrical characteristics in accordance with the optical characteristics of respective reflected light components. The sensing signals output from the photosensors PHS may be converted into an original image, and may be used to identify the user's fingerprint.

FIG. 5 is a plan view illustrating a light-blocking layer according to an exemplary embodiment of the present invention.

Referring to FIG. 5, the light-blocking layer PHL according to the present disclosure may include a light-blocking mask LBM and a plurality of pinholes PIH distributed over the light-blocking mask LBM.

The light-blocking mask LBM may be formed of light-blocking and/or light-absorbing materials. For example, the light-blocking mast LBM may be formed of an opaque metal layer (conductive layer) which is locally opened in portions in which individual pinholes PIH are disposed. However, a material used to form the light-blocking mask LBM is not limited to such a metal material, and the light-blocking mask LBM may be formed of various types of materials that are capable of blocking the transmission of light. For example, the light-blocking mask LBM may be formed of a currently known black matrix material.

The pinholes PIH may be openings distributed over the light-blocking mask LBM. The pinholes PIH may be distributed over the light-blocking mask LBM in a regular or irregular pattern to have a predetermined size and an interval. Further, the pinholes PIH may be disposed at a resolution lower than that of photosensors PHS disposed on a sensor layer PSL. However, the present disclosure is not limited thereto, and the size, number, resolution and/or array structure of the pinholes PIH may be changed in various forms.

In the embodiment of FIG. 5, although the pinholes PIH are illustrated as having rectangular shapes, the technical spirit of the present disclosure is not limited thereto. For example, in various embodiments, the pinholes PIH may have various shapes, such as a rectangular, circular, elliptical, or polygonal shape.

The light-blocking layer PHL may be interposed between a light-emitting element layer LDL in which light-emitting elements LD are arranged and the sensor layer PSL in which the photosensors PHS are arranged, in the display device 10 illustrated in FIG. 4. The light-blocking layer PHL may constitute an optical system for selectively transmitting only partial light and blocking the remaining light.

The light-blocking layer PHL, together with the above-described photosensors PHS, may constitute a fingerprint sensor. Further, the light-blocking layer PHL may be integrated with the circuit-element layer of the display panel 110. In this case, the module thickness of the photo-sensing-type fingerprint sensor and the display device equipped with the fingerprint sensor may be reduced or minimized.

As described above, the display device 10 according to the present disclosure may include a fingerprint sensor including the light-emitting element layer LDL, the sensor layer PSL, and the light-blocking layer PHL. The light-emitting element layer LDL may include light-emitting elements LD that are capable of also functioning as the light sources of photo-sensing-type sensors. The sensor layer PSL may include photosensors PHS which receive light reflected from an object (e.g., a fingerprint area of the finger) located on the top of the display device 10 after being emitted from the light-emitting element layer LDL. The light-blocking layer PHL may include pinholes PIH which are disposed between the light-emitting element layer LDL and the sensor layer PSL to selectively transmit the reflected light In accordance with an exemplary embodiment of the present invention, the fingerprint sensor may further include an optical aperture formed in the display panel 110 in order to reduce the loss of reflected light that is incident on each pinhole PIH without the range of angles of a predetermined field of view. Also, the fingerprint sensor may include a light control layer disposed in the display panel 110 and configured to control an optical path so that the field of view is more easily controlled. Various embodiments of the light control layer will be described in detail below with reference to FIGS. 6, 7 and 8.

The display device 10 may also utilize the light-emitting elements LD of the pixels PXL as light sources of the fingerprint sensor, but the present invention is not limited thereto. For example, the display device according to other exemplary embodiments of the present invention may include a separate light source for fingerprint sensing.

Part of the light emitted from the pixels PXL may be incident on the photosensors PHS after being reflected from a user's finger and passing through the optical aperture and the pinholes PIH formed in each layer of the display device 10. Here, the shape of the user's fingerprint (fingerprint pattern) may be detected based on the difference between the quantities of light reflected from the ridges and valleys of the fingerprint and/or the waveforms of the reflected light.

Figures 6, 7:
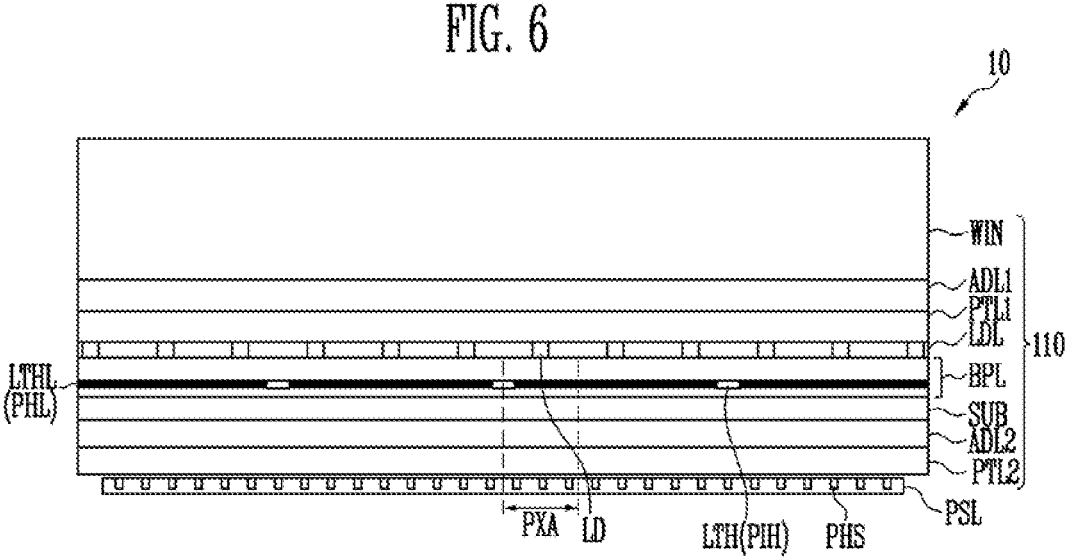
FIG. 6 is a schematic cross-sectional view illustrating a display panel according to an exemplary embodiment of the present invention.
FIG. 7 is a schematic cross-sectional view illustrating a display panel according to an exemplary embodiment of the present invention.
Figure 8:
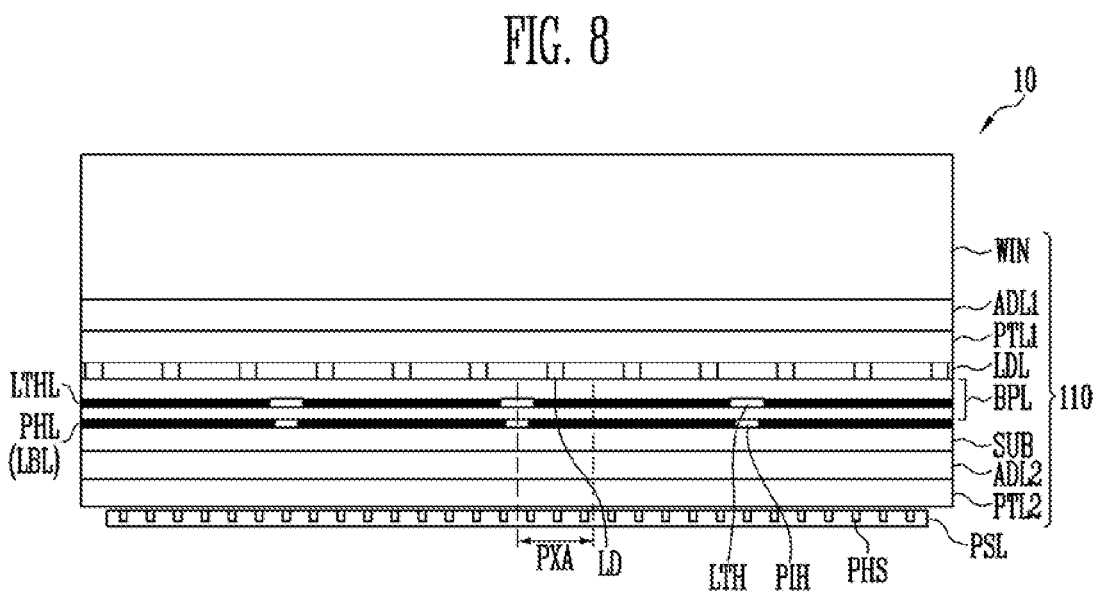
FIG. 8 is a schematic cross-sectional view of a display panel according to an exemplary embodiment of the present invention.

FIG. 6 is a schematic sectional view of a display panel according to an exemplary embodiment of the present invention. FIG. 7 is a schematic sectional view of a display panel according to an exemplary embodiment of the present invention. FIG. 8 is a schematic sectional view of a display panel according to an exemplary embodiment of the present invention. In FIGS. 6, 7 and 8, a detailed description of components similar or identical to those of the foregoing exemplary embodiments of the present invention will be omitted.

Referring to FIG. 6, the circuit-element layer BPL may include a light transmission hole array layer LTHL disposed in a sensing area SA. For example, the light transmission hole array layer LTHL may include a plurality of light transmission holes LTH distributed across a plane of the circuit-element layer BPL. The light transmission hole array layer LTHL may be provided instead of a light-blocking layer PHL. For example, the light transmission holes LTH may function as respective pinholes PIH.

As illustrated in FIG. 6, when the light-blocking layer PHL is not separately provided and the pinholes PIH are configured using the plurality of light transmission holes LTH distributed over the circuit-element layer BPL, a separate mask process for forming the light-blocking layer PHL may be omitted. Further, the display device 10 according to the exemplary embodiment of the present invention illustrated in FIG. 6 may be prevented from increasing its thickness due to additional provision of the light-blocking layer PHL, and may reduce manufacturing costs and increase manufacturing efficiency.

Referring to FIGS. 7 and 8, a circuit-element layer BPL may include a light transmission hole array layer LTHL including a plurality of light transmission holes LTH. Also, a light-blocking layer PHL including a plurality of pinholes PIH may be interposed between the substrate SUB and the circuit-element layer BPL. Each light transmission hole LTH and each pinhole PIH may be arranged to at least partially overlap each other.

In various exemplary embodiments of the present invention, the light transmission holes LTH and the pinholes PIH may have identical or different sizes. For example, the light transmission holes LTH may have a width (e.g., a diameter) smaller than a width of the pinholes PIH, as illustrated in FIG. 7. For example, the pinholes PIH and the light transmission holes LTH may have widths (e.g., diameters) ranging from 5 μm to 20 μm, and the light transmission holes LTH may each have a width (e.g., a diameter) less than a width (e.g., a diameter) of the pinholes PIH.

In an exemplary embodiment of the present invention in which the light transmission holes LTH have a size less than a size of the pinholes PIH, the light transmission hole array layer LTHL may perform a function of a light control layer (LBL) of controlling an optical path (e.g., limiting the field of view of reflected light to the range of predetermined angles), and the light-blocking layer PHL may perform a light-blocking function.

In contrast, the light transmission holes LTH may have a width (e.g., a diameter) greater than that of the pinholes PIH, as illustrated in FIG. 8. In this exemplary embodiment of the present invention, the light transmission hole array layer LTHL may perform a light-blocking function, and the light-blocking layer PHL may perform a function of the light control layer LBL for controlling an optical path.

Figure 9:
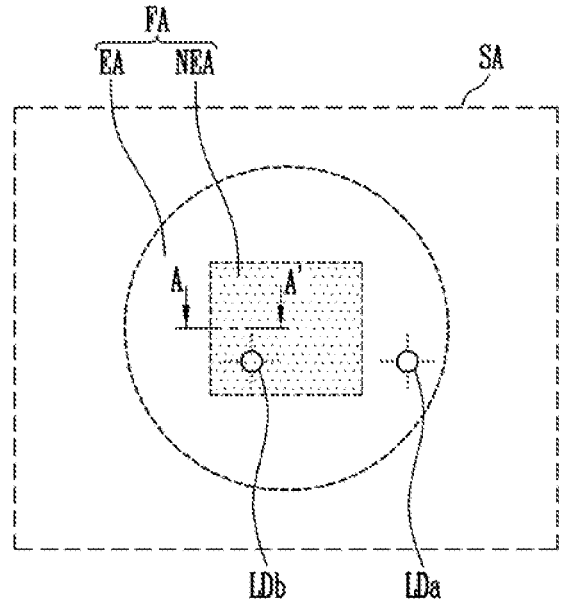
FIGS. 9 and 10 are plan views illustrating a fingerprint area of a display device according to an exemplary embodiment of the present invention.
Figure 10:
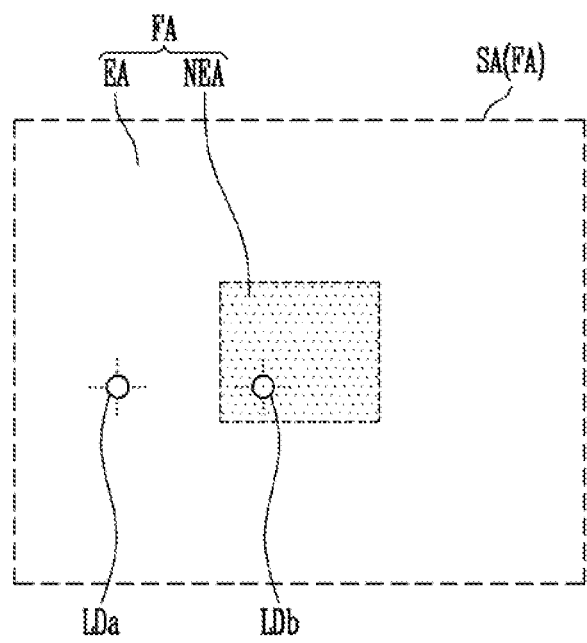
Figure 11:
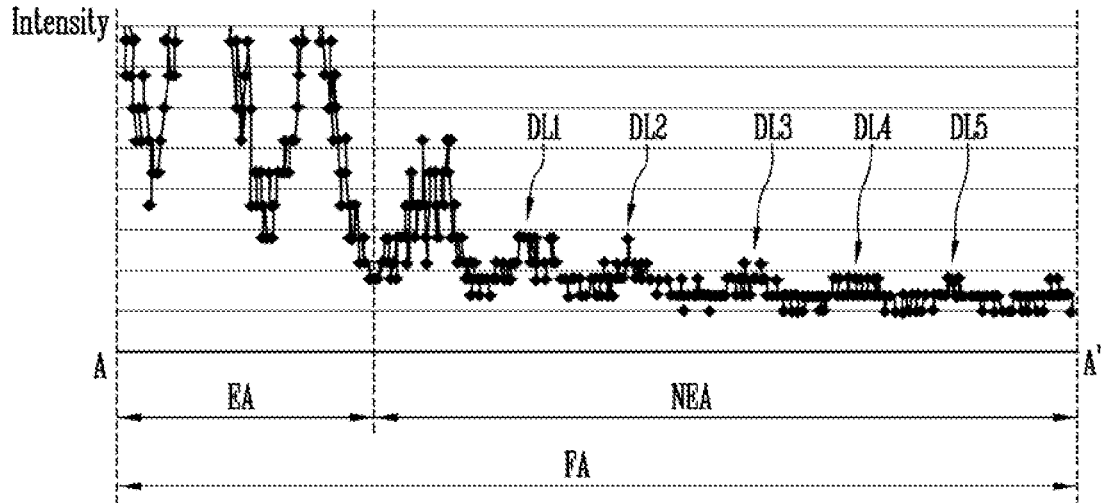
FIG. 11 is a diagram illustrating the strengths of sensing signals from photosensors arranged in a fingerprint area along line A-A' of FIG. 9.

FIGS. 9 and 10 are plan views illustrating a fingerprint area of a display device according to an exemplary embodiment of the present invention. FIG. 11 is a diagram illustrating the strengths of sensing signals from photosensors arranged in a fingerprint area along line A-A' of FIG. 9.

Referring to FIGS. 1, 9, and 10, the sensing area SA may include a fingerprint area FA including an emission area EA and a non-emission area NEA.

The fingerprint area FA may include the emission area EA (e.g., a first area) and the non-emission area NEA (e.g., a second area). The fingerprint area FA may be an area in which a finger touches or approaches, and in which fingerprint sensing is actually performed.

In an exemplary embodiment of the present invention, as illustrated in FIG. 9, at least a part of the sensing area SA may be set as the fingerprint area FA. In an exemplary embodiment of the present invention, as illustrated in FIG. 10, the entire part of the sensing area SA may be set as the fingerprint area FA.

The emission area EA may enclose the perimeter of the non-emission area NEA in a plan view (for example, adjacent edges spaced apart from one another), and the non-emission area NEA may be arranged adjacent to (e.g., overlapping) the central portion of the fingerprint area FA. For example, the arrangement of the non-emission area NEA in relation to the emission area EA may be a square within a square. All four sides of the non-emission area NEA may be equidistant from respective adjacent sides of the perimeter of the emission area EA. However, the arrangement of the emission area EA and the non-emission area NEA is not limited thereto, and the emission area EA and the non-emission area NEA may be arranged in various forms. Other arrangement relationships between the emission area EA and the non-emission area NEA will be described later with reference to FIGS. 12, 13, 14, 15 and 16.

Each of the emission area EA and the non-emission area NEA of the fingerprint area FA may include at least some pixels PXL. The pixels PXL included in the fingerprint area FA may include at least one first light-emitting element LDa and at least one second light-emitting element LDb. The emission area EA may include the at least one first light-emitting element LDa, and the non-emission area NEA may include the at least one second light-emitting element LDb.

The at least one first light-emitting element LDa of the emission area EA may emit light and provide light to the finger located in the fingerprint area FA so as to perform fingerprint sensing during a fingerprint sensing period. For example, during the fingerprint sensing period, the a plurality of first light-emitting elements LDa in the emission area EA may simultaneously or sequentially emit light. Alternatively, among a plurality of the first light-emitting elements LDa of the emission area EA, only some first light-emitting elements LDa may emit light at predetermined intervals. Alternatively, only some from among a plurality of first light-emitting elements LDa for emitting light in a specific color (e.g., light having a long wavelength, such as red light) may selectively emit light.

The light provided from the at least one first light-emitting element LDa may be reflected from the finger, and may be sensed by photosensors PHS arranged in the emission area EA. The fingerprint detector 220 may receive sensing signals from the photosensors PHS arranged in the emission area EA and may generate a fingerprint authentication image for fingerprint authentication. For example, the emission area EA may be a fingerprint authentication area.

The at least one second light-emitting element LDb may not emit light during the fingerprint sensing period. For example, during the fingerprint sensing period, light may not be provided from the light-emitting elements LDb to the finger located in the non-emission area NEA. Here, the non-emission area NEA may also be referred to as a fake verification area.

At least part of the light provided from the at least one first light-emitting element LDa may permeate into the skin of the finger, and the permeated light may be scattered and diffused inside the skin of the finger. At least part of light scattered and diffused inside the skin of the finger may travel to the non-emission area NEA along the finger, and may be emitted to the non-emission area NEA. For example, the photosensors PHS arranged in the non-emission area NEA may sense light that is scattered and diffused from inside the skin of the finger, and the fingerprint detector 220 may receive the sensing signals from the photosensors PHS arranged in the non-emission area NEA and may then generate a fake verification image.

In relation to light sensed from the non-emission area NEA, referring to FIG. 11, light is not provided to the finger located in the non-emission area NEA. However, the light provided from the emission area EA may permeate into the skin of the finger, and may then be scattered and diffused to the non-emission area NEA. Then, at least part of light scattered and diffused from the inside of the skin of the finger may be emitted to the outside of the finger towards the non-emission area NEA, and may be sensed by the photosensors PHS in the form of diffused light components DL1, DL2, DL3, DL4, and DL5.

The strengths of sensing signals (e.g., the intensity) sensed from the non-emission area NEA may be less than intensities of sensing signals sensed in the emission area EA, and the strengths of the diffused light components DL1, DL2, DL3, DL4, and DL5, which are sensed from the non-emission area NEA, may be weakened in a direction farther away from the emission area EA. For example, the diffused light components DL1, DL2, DL3, DL4 and DL5 may be spaced sequentially further from a boundary of the emission area EA towards a central portion thereof, in a plan view, and the relative intensities of the diffused light components DL1, DL2, DL3, DL4 and DL5 may also be sequentially diminished.

When a sensing target located in the fingerprint area FA is a fake fingerprint (e.g., a paper-printed fingerprint) rather than the actual finger, light permeated into the skin, as in the case of the finger, may not exist. Accordingly, light provided from the emission area EA may be neither scattered nor diffused to the non-emission area NEA.

The display device 10 including the fingerprint sensor may generate a verification value depending on the brightness of the fake verification image. The fingerprint detector 220 may analyze the grayscale values (e.g., gray levels) of the fake verification image generated in the non-emission area NEA, and may then generate an average grayscale value (e.g., gray level) of the fake verification image as the verification value.

When the verification value in the non-emission area NEA is greater than a reference value (i.e., when a predetermined amount of light is diffused and/or scattered from the skin of the finger), the fingerprint detector 220 may determine that the sensing target located in the fingerprint area FA is a biometric fingerprint, whereas when the verification value in the non-emission area NEA is less than or equal to the reference value (i.e., when a a threshold predetermined amount of light is not diffused and/or scattered from the skin of the finger), the fingerprint detector 220 may determine that the sensing target located in the fingerprint area FA is a fake fingerprint.

As described above, the display device 10 according to exemplary embodiments of the present invention may determine whether a sensing target is a fake fingerprint by sensing intensities of diffused light in the non-emission area NEA (e.g., a fake verification area), thus increasing the reliability of detection of fake fingerprints.

Further, since the display device 10 according to exemplary embodiments of the present invention does not introduce a separate device for fake fingerprint verification, determining whether a sensing target is a fake fingerprint may be accomplished without increasing manufacturing costs.

Furthermore, the display device 10 according to the exemplary embodiments of the present invention may simultaneously acquire a fingerprint recognition image for fingerprint recognition and a fake verification image for fake verification through only one fingerprint sensing operation without increasing a fingerprint sensing time.

FIGS. 12, 13, 14, 15 and 16 are plan views illustrating a fingerprint area of a display device according to various exemplary embodiments of the present invention.

Figure 12:
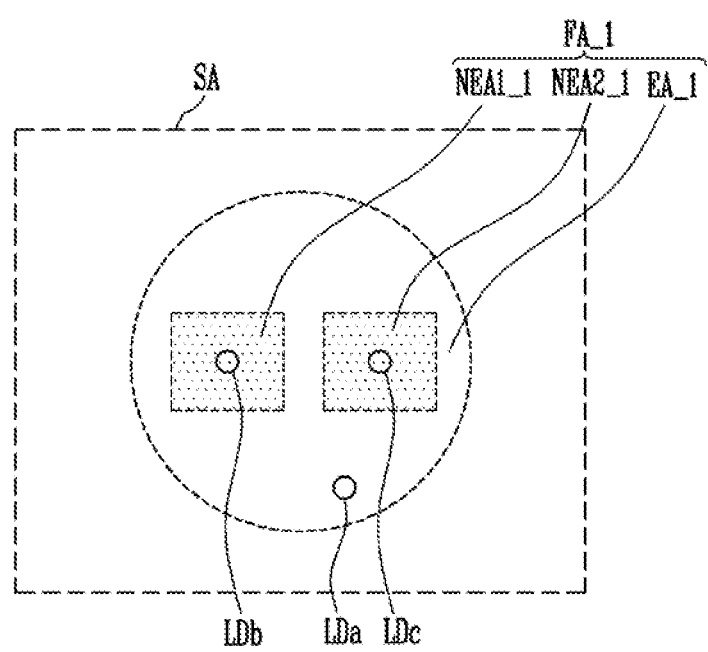

In comparison with the exemplary embodiment of the present invention depicted in FIG. 9, the exemplary embodiment of the present invention depicted in FIG. 12 is different in that it includes a plurality of non-emission areas NEA1_1 and NEA2_1.

Referring to FIGS. 1 and 12, a fingerprint area FA_1 may include an emission area EA_1, a first non-emission area NEA1_1, and a second non-emission area NEA2_1 (e.g., a third area).

The emission area EA_1 may be arranged to enclose the first non-emission area NEA1_1 and the second non-emission area NEA2_1, and the first non-emission area NEA1_1 and the second non-emission area NEA2_1 may be arranged to be spaced apart from each other. For example, the first non-emission area NEA1_1 and the second non-emission area NEA2_1 may be rectangular, and at least partially surrounded by a circular emission-area EA_1, but the present invention is not limited thereto.

Although the exemplary embodiment of the present invention depicted in FIG. 12 exemplifies a structure in which the fingerprint area FA_1 includes two non-emission areas NEA1_1 and NEA2_1, the present invention is not limited thereto. For example, the fingerprint area FA_1 may include three or more non-emission areas. Moreover, although the non-emission areas are depicted as aligned rectangles of similar size, the size, shape and arrangement may be variously changed.

Each of the emission area EA_1 and the non-emission areas NEA1_1 and NEA2_1 of the fingerprint area FA_1 may include at least one pixels PXL. The pixels PXL included in the fingerprint area FA_1 may include first to third light-emitting elements LDa, LDb, and LDc. The emission area EA_1 may include the at least one first light-emitting element LDa, the first non-emission area NEA1_1 may include the at least one second light-emitting element LDb, and the second non-emission area NEA2_1 may include the at least one third light-emitting element LDc.

The at least one first light-emitting element LDa of the emission area EA_1 may emit light and provide light to the finger located in the fingerprint area FA_1 so as to perform a fingerprint sensing operation during a fingerprint sensing period. The at least one second light-emitting elements LDb of the first non-emission area NEA1_1 and the at least one third light-emitting element LDc of the second non-emission area NEA2_1 may not emit light during the fingerprint sensing period.

The light provided from the at least one first light-emitting element LDa may be reflected from the finger, and may be sensed by photosensors PHS arranged in the emission area EA_1. The fingerprint detector 220 may receive sensing signals from the photosensors PHS arranged in the emission area EA_1 and may then generate a fingerprint authentication image for fingerprint authentication.

At least part of light provided from the first light-emitting elements LDa may permeate into the skin of the finger and then be scattered and diffused, and the scattered and diffused light may be sensed by the photosensors PHS arranged in the first non-emission area NEA1_1 and by the photosensors PHS arranged in the second non-emission area NEA2_1. The fingerprint detector 220 may receive sensing signals from the photosensors PHS arranged in the first and second non-emission areas NEA1_1 and NEA2_1 and may then generate a first fake verification image and a second fake verification image for fake verification.

The fingerprint detector 220 of the display device 10 may perform a fingerprint authentication procedure using the fingerprint authentication image. Further, based on the first and second fake verification images, whether a sensing target is a fake fingerprint may be determined. For example, the fingerprint detector 220 may generate respective verification values (e.g., average grayscale values) of the first and second fake verification images, compare the verification values with a preset reference value, and determine that the sensing target is a fake fingerprint when at least one of the verification values of the first and second fake verification images is less than or equal to the reference value. According to an exemplary embodiment of the present invention, the fingerprint detector 220 may determine that the sensing target is a fake fingerprint when the verification values of both the first and second fake verification images are less than or equal to the reference value.

For example, in comparison with the exemplary embodiment of the present invention depicted in FIG. 9, the exemplary embodiment of the present invention depicted in FIG. 12 forms a plurality of fake verification images in the fingerprint area FA_1, thus whether a sensing target is a fake fingerprint may be more accurately determined.

Figure 13:
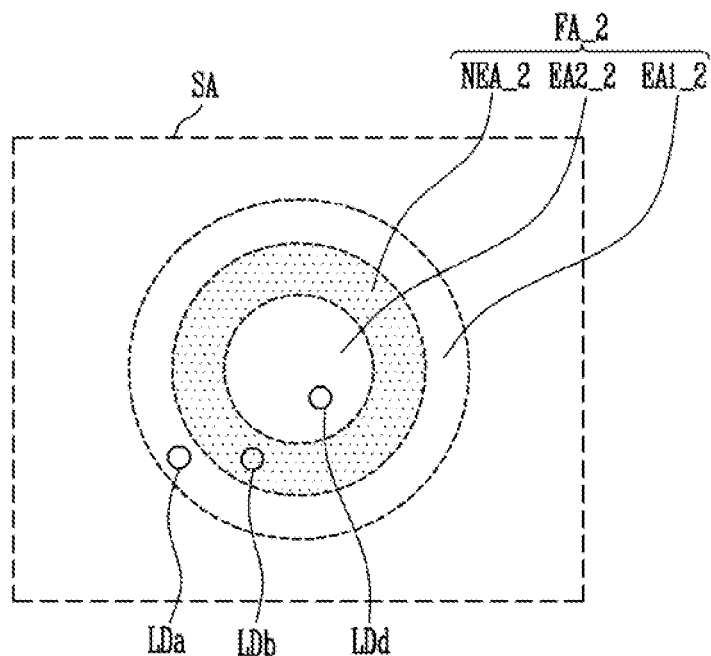

In comparison with the exemplary embodiment of the present invention depicted in FIG. 9, an exemplary embodiment of the present invention depicted in FIG. 13 is different in that it includes a plurality of emission areas EA1_2 and EA2_2.

Referring to FIGS. 1 and 13, a fingerprint area FA_2 may include a first emission area EA1_2, a second emission area EA2_2 (e.g., a third area), and a non-emission area NEA_2 arranged as concentric circles.

The first emission area EA1_2 may be arranged to enclose the non-emission area NEA_2, and the non-emission area NEA_2 may be arranged to enclose the second emission area EA2_2. For example, the first emission area EA1_2 may be arranged to enclose both the non-emission area NEA_2 and the second emission area EA2_2, and the non-emission area NEA_2 may be interposed between the first emission area EA1_2 and the second emission area EA2_2. The second emission area EA2_2 may be an innermost solid circle with a smallest radius among the components of the fingerprint area FA_2. The non-emission area NEA_2 and the first emission area EA1_2 may represent sequential concentric circles surrounding the second emission area EA2_2, with sequentially larger radii.

Each of the first emission area EA1_2, the second emission area EA2_2, and the non-emission area NEA_2 of the fingerprint area FA_2 may include at least some pixels PXL. The pixels PXL included in the fingerprint area FA_2 may include first to third light-emitting elements LDa, LDb, and LDd. The first emission area EA1_2 may include the at least one first light-emitting element LDa, the non-emission area NEA_2 may include the at least one second light-emitting element LDb, and the second emission area EA2_2 may include the at least one third light-emitting element LDd.

The first and third light-emitting elements LDa and LDd of the first and second emission areas EA1_2 and EA2_2 may emit light and provide light to the finger located in the fingerprint area FA_2 so as to perform fingerprint sensing during a fingerprint sensing period. The at least one second light-emitting element LDb of the non-emission area NEA_2 may not emit light during the fingerprint sensing period.

The light provided from the first and third light-emitting elements LDa and LDd may be reflected from the finger, and may be sensed by photosensors PHS arranged in the first and second emission areas EA1_2 and EA2_2. The fingerprint detector 220 may receive respective sensing signals from the photosensors PHS arranged in the first and second emission areas EA1_2 and EA2_2, and then generate a first fingerprint authentication image and a second fingerprint authentication image for fingerprint authentication.

At least part of the light provided from the first and third light-emitting elements LDa and LDd may permeate into the skin of the finger and then be scattered and diffused inside the skin, and may be sensed by photosensors PHS arranged in the non-emission area NEA_2. The fingerprint detector 220 may receive sensing signals from the photosensors PHS arranged in the non-emission area NEA_2 and then generate a fake verification image for fake verification.

The fingerprint detector 220 of the display device 10 may perform a fingerprint authentication procedure using the first and second fingerprint authentication images. Also, based on the fake verification image, whether a sensing target is a fake fingerprint may be determined.

In comparison with the exemplary embodiment of the present invention depicted in FIG. 9, since the exemplary embodiment of the present invention depicted in FIG. 13 forms a plurality of fingerprint authentication images in the fingerprint area FA_2, the fingerprint authentication procedure may be more accurately performed.

Figure 14:
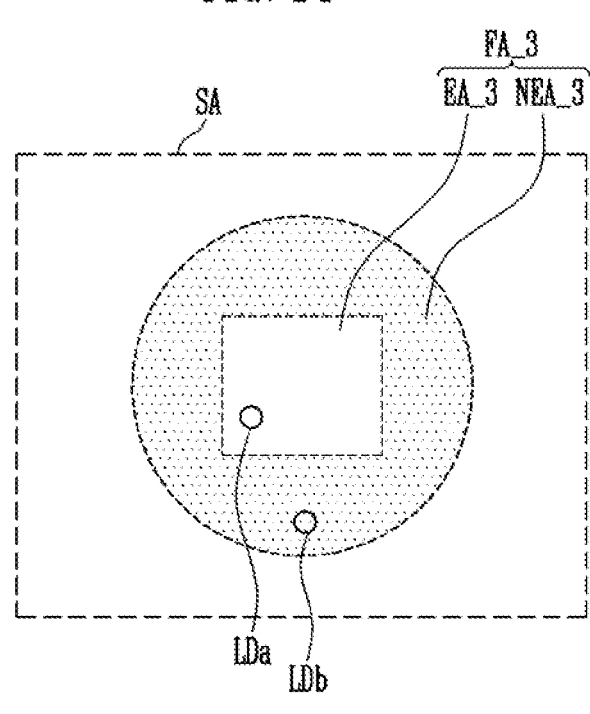

Referring to FIG. 14, a fingerprint area FA_3 may include an emission area EA_3 and a non-emission area NEA_3.

Unlike the exemplary embodiment of the present invention depicted in FIG. 9, an exemplary embodiment of the present invention depicted in FIG. 14 is different in that the non-emission area NEA_3 of the fingerprint area FA_3 is arranged to enclose the emission area EA_3, and other components are identical or similar to those described in FIG. 9, and thus a detailed description thereof will be omitted. For example, the perimeter of the emission area EA_3 may be at least partially surrounded by the non-emission area NEA_3. The emission area EA_3 may have a square shape in which sides are disposed at substantially a same distance from a circumference of the non-emission area NEA_3. A radius of the non-emission area NEA_3 may extend from a center locus of the emission area EA_3.

Figure 15:
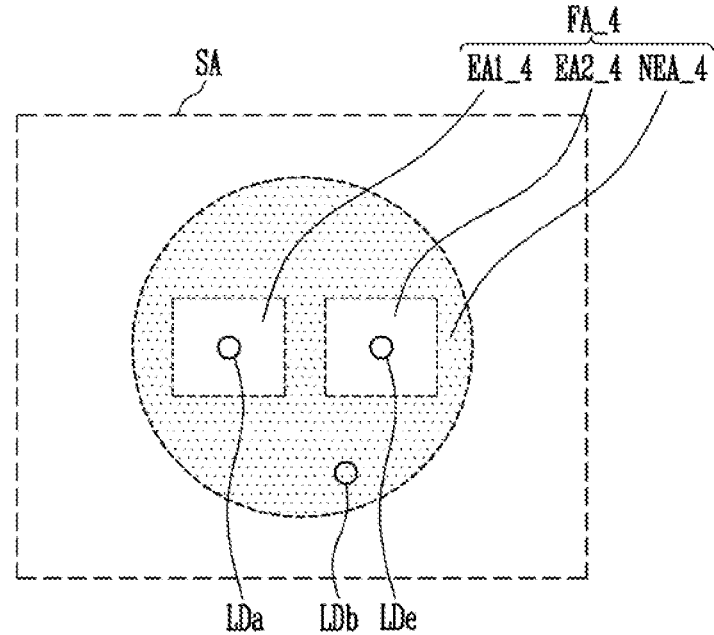

Referring to FIG. 15, a fingerprint area FA_4 may include a first emission area EA1_4, a second emission area EA2_4, and a non-emission area NEA_4.

The non-emission area NEA_4 may be arranged to enclose the first emission area EA1_4 and the second emission area EA2_4, and the first emission area EA1_4 and the second emission area EA2_4 may be arranged to be spaced apart from each other.

Although the exemplary embodiment of the present invention depicted in FIG. 15 exemplifies a structure in which the fingerprint area FA_4 includes two emission areas EA1_4 and EA2_4, the present invention is not limited thereto. For example, the fingerprint area FA_4 may include three or more emission areas. The shapes and arrangement of the emission areas and the non-emission area may be inverted in comparison to FIG. 12. For example, the two emission areas EA1_4 and EA2_4 may be spaced squares, each entirely surrounded by a circular non-emission area NEA_4.

Each of the first emission area EA1_4, the second emission area EA2_4, and the non-emission area NEA_4 of the fingerprint area FA_4 may include at least one pixel PXL. The pixels PXL included in the fingerprint area FA_4 may include first to third light-emitting elements LDa, LDb, and LDe. The first emission area EA1_4 may include the at least one first light-emitting element LDa, the non-emission area NEA_4 may include the at least one second light-emitting element LDb, and the second emission area EA2_4 may include the at least one third light-emitting element LDe.

The first and third light-emitting elements LDa and LDe of the first and second emission areas EA1_4 and EA2_4 may emit light and provide light to the finger located in the fingerprint area FA_4 so as to perform a fingerprint sensing operation during a fingerprint sensing period. The at least one second light-emitting element LDb of the non-emission area NEA_4 may not emit light during the fingerprint sensing period.

The light provided from the first and third light-emitting elements LDa and LDe may be reflected from the finger, and may be sensed by photosensors PHS arranged in the first and second emission areas EA1_4 and EA2_4. The fingerprint detector 220 may receive respective sensing signals from the photosensors PHS arranged in the first and second emission areas EA1_4 and EA2_4, and then generate a first fingerprint authentication image and a second fingerprint authentication image for fingerprint authentication.

At least part of the light provided from the first and third light-emitting elements LDa and LDe may permeate into the skin of the finger and then be scattered and diffused inside the skin, and may be sensed by photosensors PHS arranged in the non-emission area NEA_4. The fingerprint detector 220 may receive sensing signals from the photosensors PHS arranged in the non-emission area NEA_4 and then generate a fake verification image for fake verification.

Figure 16:
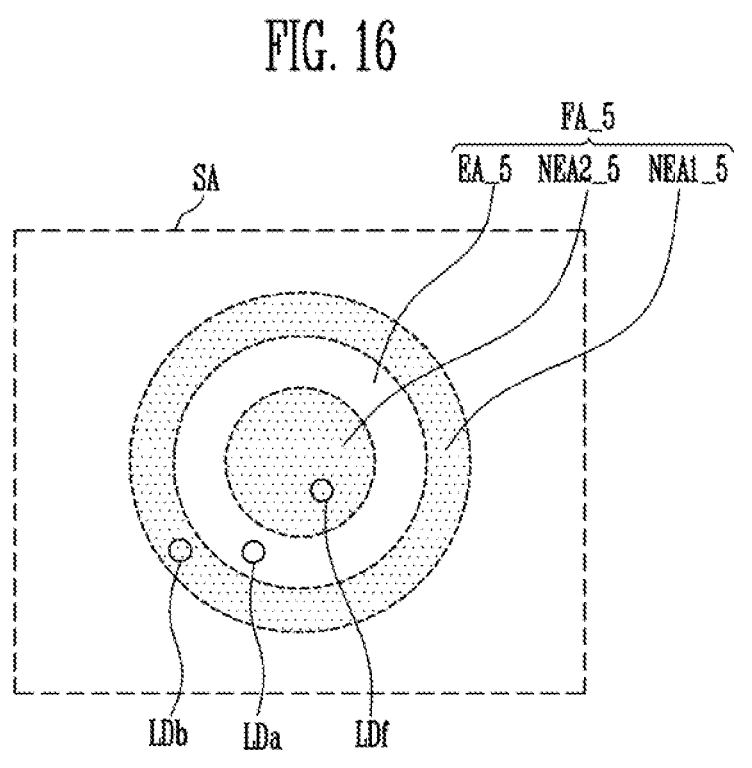

Referring to FIG. 16, a fingerprint area FA_5 may include an emission area EA_5, a first non-emission area NEA1_5, and a second non-emission area NEA2_5. The shapes and arrangement of the emission area and the non-emission areas may be inverted. For example, an innermost circle may be the second non-emission area NEA2_5, a second middle concentric circle at least partially surrounding the innermost concentric circle may be the emission area EA_5, and the outermost concentric circle at least partially surrounding the middle concentric circle may be the first non-emission area NEA2_5, each with sequentially larger radii.

The first non-emission area NEA1_5 may be arranged to enclose the emission area EA_5, and the emission area EA_5 may be arranged to enclose the second non-emission area NEA2_5. For example, the first non-emission area NEA1_5 may be arranged to enclose both the emission area EA_5 and the second non-emission area NEA2_5, and the emission area EA_5 may be interposed between the first non-emission area NEA1_5 and the second non-emission area NEA2_5.

Each of the emission area EA_5 and the non-emission areas NEA1_5 and NEA2_5 of the fingerprint area FA_5 may each include at least one pixels PXL. The pixels PXL included in the fingerprint area FA_5 may include first to third light-emitting elements LDa, LDb, and LDf. The emission area EA_5 may include the at least one first light-emitting element LDa, the first non-emission area NEA1_5 may include the at least one second light-emitting element LDb, and the second non-emission area NEA2_5 may include the at least one third light-emitting element LDf.

The at least one first light-emitting element LDa of the emission area EA_5 may emit light and provide light to the finger located in the fingerprint area FA_5 so as to perform a fingerprint sensing operation during a fingerprint sensing period. The at least one second light-emitting element LDb of the first non-emission area NEA1_5 and the at least one third light-emitting element LDf of the second non-emission area NEA2_5 may not emit light during the fingerprint sensing period.

The light provided from the at least one first light-emitting element LDa may be reflected from the finger, and may be sensed by photosensors PHS arranged in the emission area EA_5. The fingerprint detector 220 may receive sensing signals from the photosensors PHS arranged in the emission area EA_5 and then generate a fingerprint authentication image for fingerprint authentication.

At least part of light provided from the at least one first light-emitting element LDa may permeate into the skin of the finger and then be scattered and diffused, and the scattered and diffused light may be sensed by the photosensors PHS arranged in the first non-emission area NEA1_5 and by the photosensors PHS arranged in the second non-emission area NEA2_5. The fingerprint detector 220 may receive sensing signals from the photosensors PHS arranged in the first and second non-emission areas NEA1_5 and NEA2_5 and then generate a first fake verification image and a second fake verification image for fake verification.

Figure 17:
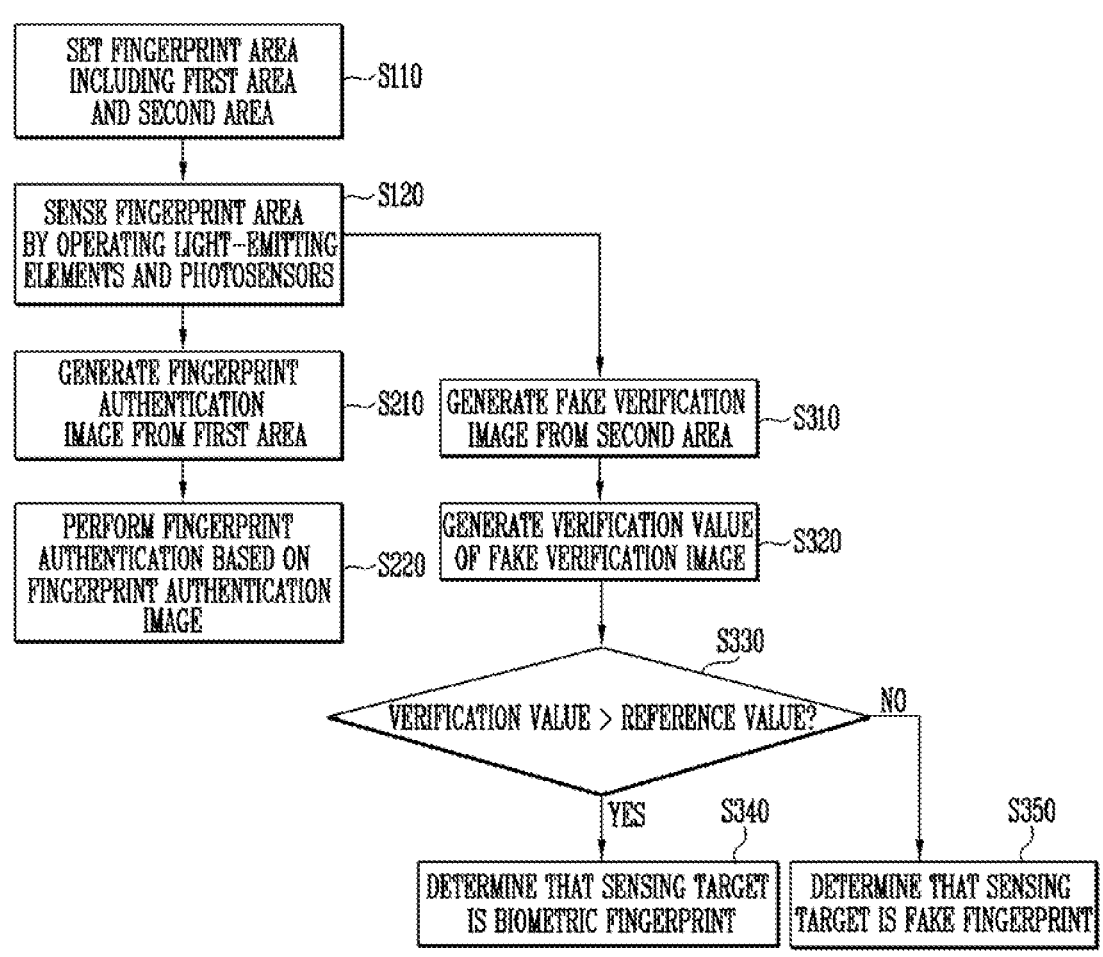
FIG. 17 is a flowchart illustrating a fingerprint sensing method using a display device according to an exemplary embodiment of the present invention.

FIG. 17 is a flowchart illustrating a fingerprint sensing method using a display device according to an exemplary embodiment of the present invention. In particular, FIG. 17 is a flowchart illustrating a fingerprint sensing method performed by the fingerprint detector 220 of FIG. 1.

Referring further to FIG. 17 together with FIGS. 1, 4, and 9, the fingerprint detector 220 may set a fingerprint area FA including a first area (e.g., an emission area EA) and a second area (e.g., a non-emission layer NEA) at step S110.

Although a location where the fingerprint area FA is set in the sensing area SA may be designated by a touch sensor layer of the display device 10, the location is not limited thereto. For example, the fingerprint detector 220 may receive location information from an application program (e.g., an application) executed on the display device 10, and may then set the fingerprint area FA.

Next, the fingerprint detector 220 may sense the fingerprint area FA by operating light-emitting elements LD and photosensors PHS at step S120.

As described above, among the light-emitting elements LD, first light-emitting elements LDa arranged in the first area (e.g., the emission area EA) emit light, but second light-emitting elements LDb arranged in the second area (e.g., the non-emission area NEA) may not emit light. Accordingly, of the light provided from the first light-emitting elements LDa, reflected light that is reflected from the finger may be sensed by photosensors PHS arranged in the first area (e.g., the emission area EA). Also, of light provided from the first light-emitting elements LDa, diffused light that has been scattered and diffused by the skin of the finger and that is diffused to the second area (e.g., the non-emission area NEA) may be sensed by photosensors PHS arranged in the second area (e.g., the non-emission area NEA).

Next, the fingerprint detector 220 may receive sensing signals from the photosensors PHS arranged in the fingerprint area FA and then generate a fingerprint authentication image and a fake verification image. In detail, the fingerprint detector 220 may generate a fingerprint authentication image from the sensing signals received from the photosensors PHS arranged in the first area (e.g., the emission area EA) at step S210, and may generate a fake verification image from the sensing signals received from the photosensors PHS arranged in the second area (e.g., the non-emission area NEA) at step S310.

Next, the fingerprint detector 220 may perform a fingerprint authentication procedure based on the fingerprint authentication image at step S220, and may perform a fake verification procedure based on the fake verification image at steps S320, S330, S340 and S350.

In the case of the fingerprint authentication procedure, the fingerprint detector 220 may compare the fingerprint authentication image with externally acquired data or reference data previously stored in the fingerprint detector 220, and may then determine whether the authentication of the fingerprint has succeeded.

In the case of the fake verification procedure, the fingerprint detector 220 may generate a verification value based on the fake verification image at step S320. As described above, the fingerprint detector 220 may analyze the grayscale values (e.g., gray levels) of the fake verification image, and then generate an average grayscale value of the grayscale values as the verification value.

Next, the fingerprint detector 220 may compare the generated verification value with a preset reference value at step S330. When the verification value is greater than the reference value, the fingerprint detector 220 may determine that a sensing target is a biometric fingerprint at step S340, whereas when the verification value is less than or equal to the reference value, the fingerprint detector 220 may determine that the sensing target is a fake fingerprint at step S350.

In the present exemplary embodiment of the present invention, the fingerprint authentication procedure based on the fingerprint authentication image and the fake verification procedure based on the fake verification image may be simultaneously performed, but the present invention is not limited thereto. In an example, the fingerprint detector 220 may first perform the fake verification procedure. The fingerprint detector 220 may determine whether a sensing target is a fake fingerprint, and thereafter perform the fingerprint authentication procedure when it is determined that the sensing target is not a fake fingerprint. In an example, the fingerprint detector 220 may first perform the fingerprint authentication procedure.

Since the display device according to the present invention may determine whether a sensing target is a fake fingerprint by sensing diffused light in a non-emission area, the reliability and security of the display device against fake fingerprints may be increased.

Since the display device according to exemplary embodiments of the present invention does not introduce an additional device for verifying fake fingerprints, manufacturing costs of the display device may be reduced.

Furthermore, the display device according to the present invention may simultaneously acquire a fingerprint recognition image for fingerprint recognition and a fake verification image for fake verification through only one fingerprint sensing operation without increasing a fingerprint sensing time.

While exemplary embodiments of the present invention have been shown and described above, it will be understood by those of ordinary skill in the art that various changes in form and details may be made therein without departing from the spirit and scope of the present invention, as defined by the following claims.

What is claimed is:

1. A display device, comprising:
   a substrate including a fingerprint area including a first area and a second area enclosed by the first area, wherein the first area contacts the second area;
   a light-emitting element layer including light-emitting elements configured to emit light of a same color, wherein the light-emitting elements include a first light-emitting element arranged in the first area and a second light-emitting element arranged in the second area; and
   a sensor layer including a plurality of photosensors configured to receive dispersed and/or scattered light during a sensing period, wherein the photosensors include a first photosensor arranged in the first area and a second photosensor arranged in the second area,
   wherein, during the sensing period, the first light-emitting element emits light and the second light-emitting element does not emit light,
   wherein, during the sensing period, the first photosensor senses the dispersed and/or scattered light from the first light-emitting element, and the second photosensor senses the dispersed and/or scattered light from the first light-emitting element,
   wherein the first area is an emission area and the second area is a non-emission area during the sensing period,
   wherein the display device further comprises a fingerprint detector configured to receive sensing signals from photosensors including the first photosensor disposed in the area corresponding to the first area to generate a fingerprint authentication image, and to receive sensing signals from photosensors including the second photosensor disposed in an area corresponding to the second area to generate a fake verification image, and
   wherein patterns of the fingerprint area defined by the emission area and the non-emission area are identical during both fake fingerprint verification and fingerprint authentication.

2. The display device according to claim 1, wherein the light-emitting element layer is disposed on a first surface of the substrate, and
   wherein the sensor layer is disposed on a second surface of the substrate.

3. The display device according to claim 1,
   wherein, during the sensing period, a maximum strength of a sensing signal sensed from the second photosensor is less than a maximum strength of a sensing signal sensed from the first photosensor.

4. The display device according to claim 1, wherein the fingerprint detector performs a fingerprint authentication procedure based on the fingerprint authentication image.

5. The display device according to claim 1, wherein the fingerprint detector generates an average gray level of the fake verification image as a verification value.

6. The display device according to claim 5, wherein the fingerprint detector compares the verification value with a preset reference value, and then determines whether a sensing target located in the fingerprint area is a fake fingerprint.

7. The display device according to claim 6, wherein, when the verification value is greater than the reference value, the fingerprint detector determines that the sensing target is a biometric fingerprint, and wherein, when the verification value is less than or equal to the reference value, the fingerprint detector determines that the sensing target is a fake fingerprint.

8. The display device according to claim 1, wherein the sensing period is a fingerprint sensing period.

9. The display device according to claim 1, further comprising a light-blocking layer interposed between the substrate and the light-emitting element layer, the light-blocking layer including openings, wherein the light-blocking layer blocks a part of external light and transfers a remaining part of the external light to the sensor layer through the openings.

10. The display device according to claim 9, further comprising:

a circuit-element layer interposed between the light-blocking layer and the light-emitting element layer and configured such that circuit elements for driving the light-emitting elements are disposed in the circuit-element layer.

11. The display device according to claim 1, wherein the substrate further includes a third area, and the light-emitting elements further include a third light-emitting element arranged in the third area.

12. The display device according to claim 11, wherein the first area encloses the third area, and the third light-emitting element does not emit light during the sensing period.

13. The display device according to claim 12, wherein the second area and the third area are spaced apart from each other.

14. A display device, comprising:

a substrate including a first area and a second area enclosed by the first area;

a light-emitting element layer including light-emitting elements configured to emit light of a same color, wherein the light-emitting elements include a first light-emitting element arranged in the first area and a second light-emitting element arranged in the second area; and a sensor layer including a plurality of photosensors configured to receive dispersed and/or scattered light during a sensing period, wherein the photosensors include a first photosensor arranged in the first area and a second photosensor arranged in the second area, wherein, during the sensing period, the first light-emitting element emits light and the second light-emitting element does not emit light, wherein, during the sensing period, the first photosensor senses the dispersed and/or scattered light from the first light-emitting element, and the second photosensor senses the dispersed and/or scattered light from the first light-emitting element, wherein the first area is an emission area and the second area is a non-emission area during the sensing period, and wherein, during the sensing period, a maximum strength of a sensing signal sensed from the second photosensor is less than a maximum strength of a sensing signal sensed from the first photosensor, wherein the substrate further includes a third area, and the light-emitting elements further include a third light-emitting element arranged in the third area, and wherein the second area encloses the third area, and the third light-emitting element emits light during the sensing period.

* * * * *